United States Patent
Yazaki

(10) Patent No.: US 6,379,798 B1
(45) Date of Patent: Apr. 30, 2002

(54) LAMINATED COATED-MATERIAL FOR CUTTING TOOL

(75) Inventor: Itsuo Yazaki, Kanagawa (JP)

(73) Assignee: Toshiba Tungaloy Co., Ltd., Kawasaki (JP)

( * ) Notice: Subject to any disclaimer, the term of this patent is extended or adjusted under 35 U.S.C. 154(b) by 0 days.

(21) Appl. No.: 09/420,504

(22) Filed: Oct. 19, 1999

(51) Int. Cl.⁷ .................................................. B32B 9/00
(52) U.S. Cl. ...................... 428/408; 428/697; 428/698; 428/699; 428/701; 428/702; 428/704
(58) Field of Search ................................. 428/701, 702, 428/408, 704, 472, 469, 698, 697, 699

(56) References Cited

U.S. PATENT DOCUMENTS

| | | | |
|---|---|---|---|
| 4,702,970 A | * 10/1987 | Sarin et al. | .................. 428/701 |
| 5,861,210 A | * 1/1999 | Lenander et al. | ........... 428/336 |
| 5,871,850 A | * 2/1999 | Moriguchi et al. | ......... 428/698 |

FOREIGN PATENT DOCUMENTS

| | | | |
|---|---|---|---|
| GB | 1389140 | * | 4/1975 |
| JP | 55-100978 | * | 8/1980 |
| JP | 55-112733 | * | 8/1980 |
| JP | 07-227703 | * | 8/1995 |
| JP | 10-109207 | * | 10/1998 |

\* cited by examiner

*Primary Examiner*—Archene Turner
(74) *Attorney, Agent, or Firm*—Foley & Lardner

(57) ABSTRACT

There is disclosed a laminated coated-material for cutting tool which comprises a laminated coated-sintered alloy in which on the surface of a substrate comprising a hard alloy or a cermet at least two layers containing an inner layer comprising aluminum oxide and positioned at the substrate side, and an outermost layer having a decorative color and positioned at the far most side of the substrate, and the outermost layer is so coated that it is peeled off by mechanical stress.

20 Claims, No Drawings

LAMINATED COATED-MATERIAL FOR CUTTING TOOL

BACKGROUND OF THE INVENTION

1. Field of the Invention

The present invention relates to a laminated coated-material to be used for a cutting tool. More specifically, the present invention relates to a laminated coated-material in which each corner of the cutting blade for a cutting tool is coated by multi layers to easily identify whether it has been used for cutting processing or not.

2. Prior Art

In a tool made of a hard alloy having a coated layer, a decorative colored layer is provided at the outermost layer of the coated layer to identify the used cutting blade corner so that the used layer is identified whether the colored layer is peeled off or not. As the decorative colored layer, titanium nitride which appears a gold color or titanium carbonitride which appears a yellow color to red color depending on the content of nitrogen (see Japanese Provisional Patent Publication No. 66513/1974). Incidentally, in the present specification, the decorative colored system means a system that appears a color phase other than neutral color system such as white to black color.

However, in the cutting tool having such a titanium compound as an outermost layer, said titanium compound reacts with a material to be cut and said material to be cut is tend to be adhered or welded (the term "adhesion" in the specification includes adhesion by pressure or temperature, and also includes "seizure") to the cutting blade of the cutting tool. Thus, in the coated cutting tool, processing precision of the material to be cut is decreased due to adhere or weld and cutting operation cannot be continued and becomes impossible due to wear and adhesion or weld of the cutting blade during the cutting operation. When the outermost layer of the coated cutting tool is constituted by $Al_2O_3$ having a low reactivity with the material to be cut, the above-mentioned problems can be solved but the outermost layer appears a black color to a color near to black so that it is difficult or impossible to identify the portion of the used cutting blade corner.

Thus, various methods have been proposed to realize identification of the used cutting blade corner and to prevent the above-mentioned adhesion or weld.

In Japanese Provisional Patent Publication No. 52603/1996, there is disclosed a method of constituting the outermost layer at a ridge portion of the cutting blade of a cutting tool by aluminum oxide and the portion other than the outermost layer by a titanium type ceramics represented by the formula: $Ti(C_xN_yO_z)$ (wherein $0 \leq x, y, z \leq 1$). However, this method requires many steps so that it is also disadvantageous in economy.

In Japanese Provisional Patent Publication No. 2227703/1995, there is disclosed a method in which the outermost layer of a cutting tool is made aluminum oxide and a layer immediately under the outermost layer is made titanium nitride. According to this method, the above-mentioned problems can be solved but the color tone of the tool is poor and commercial value is inferior.

In Japanese Provisional Patent Publication No. 73802/1955, there is disclosed a method in which the outermost layer of a cutting tool is constituted by titanium nitride and the surface of which is made smooth whereby weld of the material to be cut can be prevented. However, according to this method, not only the steps are increased but also the weld preventing effect is insufficient.

SUMMARY OF THE INVENTION

An object of the present invention is to solve the above-mentioned problems and to provide a laminated coated-material for cutting tool which is excellent in adhesion or weld preventing effect without increasing steps, is possible to identify the corner of a cutting blade to be used, and has an appearance with a high commercial value wherein the color tone of which is a gold color.

The present inventors have carried out intensive studies to accomplish the above objects, and as a result, they have found that the objects can be accomplished by so constituting the outermost layer of a cutting tool having a color that it is peeled off by mechanical stress. When the outermost layer of a cutting blade to be used for cutting is peeled off by mechanical stress, adhesion or weld of a material to be cut can be prevented and a layer having a color tone of a neutral color such as an aluminum oxide layer is exposed whereby the portion which had been used can be easily identified.

That is, the present invention relates to a laminated coated-material for cutting tool which comprises a laminated coated-sintered alloy in which on the surface of a substrate comprising a hard alloy or a cermet at least two layers containing an inner layer comprising aluminum oxide and positioned at said substrate side, and an outermost layer having a decorative color and positioned at the far most side of said substrate, and said outermost layer is so coated that it is peeled off by mechanical stress.

In the present invention, the upper limit of the adhesive force is that peeling of the outermost layer occurs at the portion of the surroundings at which an indenter is contacted when 588 N (60 kgf) of load is applied to the test piece by using Rockwell hardness testing machine. The lower limit of the same is not specifically limited and a material can be used if it is identifiable before and after the use whereas if the outermost layer peeled off only by wiping a hand or a cloth, it cannot be practically used.

DESCRIPTION OF THE PREFERRED EMBODIMENTS

Hereinafter, the present invention is described in detail.

The substrate to be used for the laminated coated-material for a cutting tool of the present invention comprises a hard alloy or a cermet. Such a substrate is a sintered alloy having high hardness and obtained by sintering at least one material selected from the group consisting of a carbide, a nitride and a solid solution of a metal of Group 4 to Group 6 of the Periodic Table, and at least one metal selected from the group consisting of iron, nickel and cobalt. Among these materials, the hard alloy may include, for example, WC—Co, WC—TaC—Co, WC—TiC—Co, WC—TiC—TaC—Co, etc. As the cermet, there may be mentioned, for example, a titanium carbide series cermet such as TiC—Ni, TiC—Ni—Cr, TiC—Ni—W, TiC—Co, TiC—Co—Cr, etc.; and a titanium carbonitride series cermet containing nitrogen in the above-mentioned titanium carbide series cermet.

Of these, preferred is a hard alloy comprising 3 to 10% by weight of a binder phase mainly comprising cobalt and/or nickel, and the reminder being a hard phase mainly comprising tungsten carbide.

The laminated coated-material of the present invention is constituted by the above-mentioned substrate, and a coated portion in which at least one part of the surface, particularly a plural number of surfaces containing a plural number of corners of a cutting blade is covered by a coating layer in which a plural number of films is laminated. Said coated portion contains an inner layer positioned at said substrate side and an outermost layer which is farthest from said substrate, and if necessary, at least one of a subbing layer between the substrate and the inner layer and an intermediate layer between the inner layer and the outermost layer may be provided.

The inner layer comprises aluminum oxide. The thickness of said inner layer is not particularly limited, and preferably within the range of 0.1 to 10.0 $\mu$m, more preferably 0.5 to 6.0 $\mu$m. The surface of the inner layer preferably has an average surface roughness represented by the depth of unevenness of said surface observed at the perpendicular section to said surface of 0.6 $\mu$m or less.

The outermost layer has a decorative color tone, and may preferably comprise titanium nitride, titanium nitroxide, titanium carbonitride, titanium carbonitroxide, zirconium nitride, (titanium-aluminum)nitride, (titanium-aluminum) nitrocarbide, (titanium-aluminum) carboxide, etc. Among these, the outermost layer preferably comprises titanium nitride, titanium nitroxide, zirconium nitride and zirconium nitroxide since they have bright color tone and are easily identifiable at the used cutting blade corner. The thickness of the outermost layer is not particularly limited but preferably 0.1 $\mu$m or more since it is easily identifiable, more preferably in the range of 0.1 to 3.0 $\mu$m from economical view point.

The above-mentioned outermost layer is so coated that it is not peeled off by the usual handling but peeled off by mechanical stress provided by contacting with a material to be cut at the time of starting cutting. As a result, the material to be cut and an inner layer are actually contacted with each other at the time of actual cutting processing whereby adhesion or weld at the time of cutting procedure can be prevented. As a method of forming the outermost layer such that it is easily peeled off, the following methods can be specifically mentioned but the present invention is not limited by these.

(1) An intermediate layer for promoting peeling is further provided between the inner layer and the outermost layer to easily peel off the outermost layer. As the intermediate layer, carbon and/or a metal sulfide can be used. As said metal sulfide, there may be mentioned molybdenum sulfide, tungsten sulfide, etc., and they can be used singly or in combination of two or more. When a plural number of substances is used in combination as the intermediate layer, they may be provided as a composite coating layer comprising these substances, or may be separately provided as independent coating layers. As such an intermediate layer for promoting peeling, carbon is preferred. The thickness of said intermediate layer is not particularly limited but preferably within the range of 0.1 to 1.0 $\mu$m.

Among the intermediate layers, the carbon layer can be formed, for example, in an atmosphere containing 65 to 95% by volume of argon and 5 to 35% by volume of methane ($CH_4$) at a temperature of 800 to 1100° C. under the atmospheric pressure to 100,000 Pa for the maintaining time of 1 to 10 minutes.

(2) The outermost layer is provided adjacent to the inner layer and coated preferably at a coating temperature of 400° C. or higher to less than 800° C., more preferably 700 to 750° C.

A subbing layer which is optionally provided is to impart wear resistance to the cutting tool, and may comprise, for example, at least one compound selected from the group consisting of titanium carbide, titanium nitride, titanium carbonitride, titanium carboxide, titanium nitroxide, titanium carbonitroxide, a composite nitride containing Ti and Al, a composite carbonitride containing Ti and Al, a composite nitroxide containing Ti and Al, a composite carboxide containing Ti and Al, and a composite carbonitroxide containing Ti and Al. Also, the subbing layer may comprise a multi layer, and an aluminum oxide layer may be present in the laminated subbing layers. Among the subbing layers, the first subbing layer provided adjacent to the substrate preferably comprises titanium nitride. When the first subbing layer comprises titanium nitride, the layer can be easily formed at a relatively low temperature so that the substrate is not affected at the time of film formation due to the temperature and a high peeling property can be relatively easily obtained. Also, when the subbing layer contains a columnar layer comprising a columnar shaped crystal grown perpendicularly to the surface of the substrate or contains a granular layer comprising granular crystals and a columnar layer comprising columnar crystals grown perpendicularly to the surface of the substrate, such a subbing layer is preferred since it is excellent infracture resistance. When the columnar layer comprises titanium nitride and/or titanium carbonitride, or when the granular layer comprises titanium nitride and the columnar layer comprises titanium carbonitride, such a subbing layer is preferred since it is excellent in fracture resistance and peeling resistance. The thickness of the subbing layer is not limited but preferably within the range of 2.0 to 20.0 $\mu$m. Moreover, when the subbing layer contains a diffusion element comprising the element which constitutes the substrate, more specifically, when it contains at least one diffusion element selected from W, Co and Ni, particularly when it contains Co and/or Ni, the resulting cutting tool is more excellent in fracture resistance and peeling resistance so that it is preferred.

Formation of the coating layer can be carried out, for example, by the a thermal CVD method (Chemical vapor deposition method), a plasma CVD method, a PVD method (Physical vapor deposition method), etc., but the present invention is not limited by these. Also, the case where the diffusion element is contained in the subbing layer is not limited, and incorporation of the diffusion element into the subbing layer can be carried out, for example, by the method of forming a coating layer and then subjecting to heat treatment, the method of raising the formation temperature of a coating layer, or the method of forming a coating layer and raising the temperature of the coating layer until completion of the formation thereof.

In the laminated coated-material for cutting tool according to the present invention, the outermost layer comprises a decorative colored layer and is so formed that the layer is easily peeled off by mechanical stress. More specifically, for example, when the laminated coated-material is suffered from mechanical stress by contacting with a material to be cut at the time of starting cutting, the outermost layer suffered from the mechanical stress is peeled off and an inner layer comprising aluminum oxide is exposed. Thus, at the tie of actual cutting procedure, the inner layer and the material to be cut are contacted with each other, so that resistance to weld of the material to be cut is markedly improved whereby lifetime of the cutting tool is elongated. Moreover, at the corner of the cutting blade which is not used for cutting, the outermost layer which is a decorative colored layer remains and causes difference in color tone from the inner layer so that the corner of the cutting blade used for cutting can be easily identified.

EXAMPLES

In the following, the present invention is explained in more detail by referring to Examples and Comparative examples. The present invention is not limited by these Examples.

Examples 1 to 3

A substrate made of a hard alloy which comprises 88% by weight of WC, 2% by weight of TiC, 3% by weight of TaC and 7% by weight of Co, and has a rhombus shape tip with a hole (a blade edge exchanging tip) having a cutting blade length of 12 mm, a thickness of 4.76 mm and a corner radius (i.e. nose radius) of 0.8 mm, which is a shape conventionally been used (geometry of the insert used in this example is CNMG120408) was prepared. To the substrate were laminated coating layers with the compositions using the thermal CVD method at coating temperatures shown in Table 1 to obtain laminated coated-materials.

Comparative Examples 1 to 4

In the same manner as in Examples 1 to 3 except for changing the coating temperatures of the respective coating layers as shown in Table 1, laminated coated-materials for comparative purpose were prepared.

the $Al_2O_3$ layer which is the inner layer are made both 750° C., which are different from those of the corresponding Comparative examples. Also, the tip for cutting of Example 3 is a laminated coated-material having the same constitution as in that of Comparative example 3 except for providing a carbon layer as an intermediate layer between the $Al_2O_3$ layer which is the inner layer and the TiN layer which is the outermost layer.

Evaluation Example 1

For evaluating the presence or absence of peeling by mechanical stress simply and easily, with regard to the tips for cutting prepared in Examples 1 to 3 and Comparative examples 1 to 4, a penetrator driving test using a Rockwell hardness meter under a load of 150 kgf (1470 N) was carried out and the presence or absence of peeling at the coating layer of the tips for cutting after the test was observed. As a result, whereas in the tips for cutting of Comparative examples 1 to 4, no peeling of the coating layer occurred, in the tips for cutting of Examples 1 to 3, the outermost layer of the driving surface alone peeled off in either of the tips.

Evaluation Example 2

By using Cr—Mn (chromium-manganese) steel as a material to be cut, evaluations of cutting property, peeling

TABLE 1

| | | Film constitution*[1] | | | | | Appearance |
|---|---|---|---|---|---|---|---|
| | Coated Substance | TiC | TiCN | $Al_2O_3$ | | TiN | |
| Example 1 | Film thickness (μm) | 2 | 3 | 2 | | 0.3 | Gold color |
| Comparative example 1 | Coating temperature (° C.) | | | | | | |
| | Example 1 | ←————1,050———→ | | | | ←750→ | |
| | Comparative example 1 | ←—————————1,050—————————→ | | | | | |
| | Coated Substance | TiN | TiCN | TiC | $Al_2O_3$ | TiNO | |
| Example 2 | Film thickness (μm) | 2 | 4 | 2 | 2 | 1 | Whitish gold color |
| Comparative example 2 | Coating temperature (° C.) | | | | | | |
| | Example 2 | ←900→ | ←———1,050———→ | | | ←700→ | |
| | Comparative example 2 | ←900→ | ←—————1,050—————→ | | | | |
| | Coated Substance | TiN | TiC | TiN | $Al_2O_3$ | C*[2] | TiN |
| Example 3 | Film thickness (μm) | 1 | 5 | 0.2 | 5 | 0.2 | 0.2 | Gold color |
| Comparative example 3 | Coating temperature (° C.) | | | | | | |
| | Example 3 | ←900→ | ←————1,050————→ | | | | |
| | Comparative example 3 | ←900→ | ←———1,050———→ | None | ←1,050→ | | |
| | Coated Substance | TiN | TiCN | TiC | $Al_2O_3$ | | |
| Comparative example 4 | Film thickness (μm) | 2 | 4 | 2 | 2 | | Black color |
| | Coating temperature (° C.) | ←900→ | ←————1,050————→ | | | | |

(Note)
*[1] Left side of the table is the substrate side
*[2] C layer was coated only in Example 3

As can be clearly seen from Table 1, while the tips for cutting in Examples 1 and 2 have the same constitution as in those of Comparative examples 1 and 2, respectively, but the coating temperatures of the TiN layer (Example 1) and TiNO layer (Example 2) which are the uppermost layer formed on property and identification of used corners of the cutting blades were carried out with regard to the tips prepared in Example 1 and Comparative example 1 under the cutting conditions shown in Table 2 below. The results are as shown in Table 3.

TABLE 2

|  | Evaluation example 2 | Evaluation example 3 Structural carbon steel |
|---|---|---|
| Material to be cut | Cr—Mn steel | C% = 0.45 |
| Cutting conditions | Continuous turning | Continuous turning |
| Coolant | use | use |
| Cutting speed (m/min) | 200 | 230 |
| Depth of cut (mm) | 2.0 | 2.0 |
| Feed rate (mm/rev) | 0.3 | 0.3 |
| Cutting time (min) | 60 | 60 |

TABLE 3

|  | Evaluation example 2 | |
|---|---|---|
|  | Example 1 | Comparative example 1 |
| Cutting property |  |  |
| Time when cutting is impossible*1 (min) | — | 40 |
| Average relief surface wear width (mm) | 0.24 | — |
| Peeling*2 | ○ | X |
| Identification*3 | ○ | ○ |

(Note)
*1 Due to adhesion of the material to be cut
*2 ○: Outermost layer peeled off
  X: Not peeled off
*3 ○: Identification possible
  X: Identification impossible In Evaluation example 2, a material to be cut was adhered to the tip of Comparative example 1 and cutting became impossible after 40 minutes. In the tip of Example 1, the TiN layer was peeled off with the initiation of cutting and no adhesion or weld of the material to be cut occurred, and identification of the corner of the used cutting blade could be well carried out.

Evaluation Example 3

By using a structural steel (in which hardening property is insured) as a material to be cut, evaluations of cutting property, peeling property and identification of used corners of the cutting blades were carried out with regard to the tips prepared in Examples 2 and 3, and Comparative examples 2 to 4 under the cutting conditions shown in Table 2 as mentioned above. The results are as shown in Table 4.

TABLE 4

|  | Evaluation example 3 | | | | |
|---|---|---|---|---|---|
|  | Example | | Comparative example | | |
|  | 2 | 3 | 2 | 3 | 4 |
| Cutting property |  |  |  |  |  |
| Time when cutting is impossible*1 (min) | — | — | 48 | 32 | — |
| Average relief surface wear width (mm) | 0.29 | 0.29 | — | — | 0.30 |
| Peeling*2 | ○ | ○ | X | X | — |
| Identification*3 | ○ | ○ | ○ | ○ | X |

(Note)
*1 Due to adhesion of the material to be cut
*2 ○: Outermost layer peeled off
  X: Not peeled off
*3 ○: Identification possible
  X: Identification impossible From the above results, a material to be cut was adhered to the tips of Comparative examples 2 and 3, and the tip of Comparative example 4 was impossible to identify the corner of the used cutting blade. In the tips of Examples 2 and 3, the outermost layer was peeled off with the initiation of cutting and no adhesion or weld of the material to be cut occurred, and identification of the corner of the used cutting blade could be well carried out.

According to the present invention, a laminated coated-material for cutting tool without causing no weld with a material to be cut, having a long lifetime, and identification of the corner of the used cutting blade is easy, appearance of the tool is beautiful and identification of the corner of the used cutting blade can be easily carried out can be obtained without any complex preparation procedure.

What is claimed is:

1. A laminated coated-material for cutting tool which comprises a laminated coated-sintered alloy in which on the surface of a substrate comprising a hard alloy or a cermet at least two layers containing an inner layer comprising aluminum oxide and positioned at said substrate side, and an outermost layer having a decorative color and positioned at the far most side of said substrate, and said outermost layer is so coated that it is peeled off by mechanical stress.

2. The laminated coated-material according to claim 1, wherein peeling by said mechanical stress is caused when said outermost layer is contacted with a material to be cut at starting cutting.

3. The laminated coated-material according to claim 1, wherein an intermediate layer for promoting peeling is further provided between the inner layer and the outermost layer to easily peel off the outermost layer.

4. The laminated coated-material according to claim 3, wherein the intermediate layer comprises carbon and/or a metal sulfide.

5. The laminated coated-material according to claim 1, wherein the outermost layer is provided adjacent to the inner layer and coated at a coating temperature of 400° C. or higher to less than 800° C.

6. The laminated coated-material according to claim 1, wherein the substrate is a hard alloy comprising 3 to 10% by weight of a binder phase mainly comprising cobalt and/or nickel, and the reminder being a hard phase mainly comprising tungsten carbide.

7. The laminated coated-material according to claim 1, wherein at least one of a subbing layer comprising at least one compound selected from the group consisting of titanium carbide, titanium nitride, titanium carbonitride, titanium carboxide, titanium nitroxide, titanium carbonitroxide, a composite nitride containing titanium and aluminum, a composite carbonitride containing titanium and aluminum, a composite nitroxide containing titanium and aluminum, a composite carboxide containing titanium and aluminum, and a composite carbonitroxide containing titanium and aluminum, is further provided between the substrate and the inner layer.

8. The laminated coated-material according to claim 7, wherein the subbing layer contains a columnar layer comprising a columnar shaped crystal grown perpendicularly to the surface of the substrate.

9. The laminated coated-material according to claim 7, wherein the subbing layer contains a granular layer comprising granular crystals and a columnar layer comprising columnar crystals grown perpendicularly to the surface of the substrate.

10. The laminated coated-material according to claim 8, wherein the columnar layer comprises titanium nitride and/or titanium carbonitride.

11. The laminated coated-material according to claim 9, wherein the granular layer comprises titanium nitride and the columnar layer comprises titanium carbonitride.

12. The laminated coated-material according to claim 7, wherein a first subbing layer among the subbing layers coated adjacent to the substrate comprises titanium nitride.

13. The laminated coated-material according to claim 7, wherein the subbing layer contains a diffusion element comprising the element which constituting the substrate.

14. The laminated coated-material according to claim 12, wherein the diffusion element is at least one selected from the group consisting of tungsten, cobalt and nickel.

15. The laminated coated-material according to claim 1, wherein the surface of the inner layer has an average surface roughness represented by the depth of unevenness of said surface observed at the perpendicular section to said surface of 0.6 $\mu$m or less.

16. A laminated coated-material for a cutting tool which comprises a laminated coated-sintered alloy, in which on a surface of a substrate comprising a hard alloy or a cermet at least two layers are provided: (1) an inner layer comprising aluminum oxide and that is positioned at the substrate side, and (2) an outermost layer having a decorative color and that is positioned at the far most side of the substrate, wherein the outermost layer is so coated that it is peeled off by mechanical stress, and the upper limit of the adhesive force between the inner layer and the outermost layer is such that peeling of the outermost layer occurs when at least 588 N is applied to the outermost layer.

17. The laminated coated-material according to claim 16, wherein the outermost layer is provided by coating at a temperature of 400° C. to less than 800° C.

18. A laminated coated-material for a cutting tool which comprises a substrate, at least one subbing layer, at least one inner layer and an outermost layer provided on the substrate in this order from a surface of the substrate, wherein the substrate comprises a hard alloy or a cermet, at least one of the subbing layers comprises at least one compound selected from the group consisting of titanium carbide, titanium nitride, titanium carbonitride, titanium carboxide, titanium nitroxide, titanium carbonitroxide, a composite nitride containing titanium and aluminum, a composite carbonitride containing titanium and aluminum, a composite nitroxide containing titanium and aluminum, a composite carboxide containing titanium and aluminum, and a composite carbonitroxide containing titanium and aluminum, and contains a columnar layer comprising a columnar shaped crystal grown perpendicularly to the surface of the substrate, at least one of the inner layers comprises aluminum oxide, and the outermost layer has a decorative color, and is positioned at the far most side of the substrate and is so coated that it is peeled off by mechanical stress.

19. The laminated coated-material according to claim 18, wherein the outermost layer is so provided that peeling of the outermost layer occurs when at least 588 N is applied to the outermost layer.

20. The laminated coated-material according to claim 18, wherein the columnar layer comprises titanium nitride, titanium carbonitride or both.

* * * * *